(12) United States Patent
Yamamoto et al.

(10) Patent No.: US 12,418,980 B2
(45) Date of Patent: Sep. 16, 2025

(54) WIRING BOARD

(71) Applicant: Murata Manufacturing Co., Ltd., Nagaokakyo (JP)

(72) Inventors: Tomoki Yamamoto, Nagaokakyo (JP); Tatsunori Kan, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 215 days.

(21) Appl. No.: 18/485,650

(22) Filed: Oct. 12, 2023

(65) Prior Publication Data

US 2024/0040694 A1 Feb. 1, 2024

Related U.S. Application Data

(63) Continuation of application No. PCT/JP2022/003274, filed on Jan. 28, 2022.

(30) Foreign Application Priority Data

Apr. 22, 2021 (JP) ................. 2021-072808

(51) Int. Cl.
 *H05K 1/03* (2006.01)
 *C03C 4/16* (2006.01)
 (Continued)

(52) U.S. Cl.
 CPC ............. *H05K 1/0306* (2013.01); *C03C 4/16* (2013.01); *C03C 14/004* (2013.01); *H05K 1/115* (2013.01);
 (Continued)

(58) Field of Classification Search
 CPC ...... H05K 1/0306; H05K 1/115; H05K 1/024; H05K 2201/0175; H05K 2201/0209;
 (Continued)

(56) References Cited

U.S. PATENT DOCUMENTS

2004/0096634 A1\* 5/2004 Taga ....................... H01L 23/15
 428/209
2014/0290997 A1\* 10/2014 Maeda .............. H01L 23/49822
 29/850

(Continued)

FOREIGN PATENT DOCUMENTS

JP H08274470 A 10/1996
JP H10107437 A 4/1998

(Continued)

OTHER PUBLICATIONS

International Search Report in PCT/JP2022/003274, mailed Mar. 15, 2022, 3 pages.

*Primary Examiner* — Roshn K Varghese

(74) *Attorney, Agent, or Firm* — ArentFox Schiff LLP

(57) ABSTRACT

A wiring board that includes: a wiring conductor; a first dielectric layer around the wiring conductor and containing a first glass and a first ceramic filler; and a second dielectric layer interposed between the wiring conductor and the first dielectric layer, the second dielectric layer being in contact with the wiring conductor and the first dielectric layer, and the second dielectric layer containing a second glass and a second ceramic filler. A sintering temperature of the second glass contained in the second dielectric layer is higher than a sintering temperature of the wiring conductor, and a grain size of the second glass contained in the second dielectric layer is smaller than a grain size of the first glass contained in the first dielectric layer.

14 Claims, 8 Drawing Sheets

(51) Int. Cl.
*C03C 14/00* (2006.01)
*H05K 1/11* (2006.01)

(52) U.S. Cl.
CPC ...... *C03C 2204/00* (2013.01); *C03C 2214/04* (2013.01); *C03C 2214/20* (2013.01); *H05K 2201/0175* (2013.01); *H05K 2201/0209* (2013.01)

(58) Field of Classification Search
CPC ..... H05K 2201/017; H05K 2201/0187; H05K 2201/0195; C03C 4/16; C03C 4/004; C03C 2204/00; C03C 2214/04; C03C 2214/20; C03C 10/00; C03C 17/3607; C03C 17/3649; H01L 23/15
See application file for complete search history.

(56) References Cited

U.S. PATENT DOCUMENTS

2016/0088729 A1* 3/2016 Kobuke ................ H05K 1/115
 174/251
2017/0323727 A1 11/2017 Mukoyama

FOREIGN PATENT DOCUMENTS

| | | |
|---|---|---|
| JP | 4703212 B2 | 6/2011 |
| JP | 2011114175 A | 6/2011 |
| JP | 6224853 B2 | 11/2017 |

* cited by examiner

Fig. 7

| | GRAIN SIZE (μm) OF CONSTITUENT MATERIAL OF DIELECTRIC LAYER 40 | | | GRAIN SIZE (μm) OF CONSTITUENT MATERIAL OF DIELECTRIC LAYER 30 | | | Rmax (μm) | TRANSMISSION LOSS | DELAMINATION |
|---|---|---|---|---|---|---|---|---|---|
| | CRYSTALLIZED GLASS | ALUMINA | ZIRCONIA | CRYSTALLIZED GLASS | ALUMINA | ZIRCONIA | | | |
| EXAMPLE 1 | 1.2 | 2.5 | 1.3 | 1.0 | 2.5 | 1.3 | 0.50 | ○ | ○ |
| EXAMPLE 2 | 2.0 | 2.5 | 1.3 | 1.0 | 2.5 | 1.3 | 0.50 | ○ | ○ |
| EXAMPLE 3 | 2.0 | 2.5 | 1.3 | 0.5 | 2.5 | 1.3 | 0.30 | ○ | ○ |
| EXAMPLE 4 | 2.0 | 2.5 | 1.3 | 0.5 | 1.0 | 0.7 | 0.25 | ◎ | ○ |
| EXAMPLE 5 | 2.0 | 2.5 | 1.3 | 0.5 | 0.5 | 0.7 | 0.20 | ◎ | ○ |
| EXAMPLE 6 | 2.0 | 2.5 | 1.3 | 0.5 | 0.1 | 0.7 | 0.20 | ◎ | ○ |
| COMPARATIVE EXAMPLE 1 | 2.0 | 2.5 | 1.3 | 2.0 | 2.5 | 1.3 | 1.00 | × | ○ |
| COMPARATIVE EXAMPLE 2 | 1.0 | 2.5 | 1.3 | 1.0 | 2.5 | 1.3 | 0.50 | ○ | × |

WIRING BOARD

CROSS REFERENCE TO RELATED APPLICATIONS

The present application is a continuation of International application No. PCT/JP2022/003274, filed Jan. 28, 2022, which claims priority to Japanese Patent Application No. 2021-072808, filed Apr. 22, 2021, the entire contents of each of which are incorporated herein by reference.

TECHNICAL FIELD

The present disclosure relates to a wiring board including a wiring conductor and a dielectric layer adjacent to the wiring conductor and containing a glass and a ceramic filler.

BACKGROUND ART

Glass-ceramics contain a crystallized glass and a ceramic filler. A wiring board in which glass-ceramics are used for a dielectric layer has high strength and excellent heat resistance because of the crystallized glass.

On the other hand, in a wiring board in which glass-ceramics are used for a dielectric layer, crystals are precipitated from the glass, and thus, irregularities are generated at an interface between the dielectric layer and a wiring conductor, resulting in roughness. When an electric signal passing through the wiring conductor has a high frequency, the electric signal passing through the wiring conductor concentrates near the interface with the dielectric layer because of a skin effect. Thus, when the interface between the dielectric layer and the wiring conductor is rough, the conductivity of the wiring conductor decreases, and transmission loss may occur.

In the wiring board of Patent Document 1, an intermediate layer made of a non-crystallized glass is interposed between a ceramic insulating layer corresponding to the dielectric layer and a wiring conductor. Thus, in the wiring board of Patent Document 1, crystals are not deposited from glass in the intermediate layer. Therefore, the roughness of the interface between the wiring conductor and the adjacent material can be reduced as compared with a structure without the intermediate layer.

Patent Document 1: JP-B2-4703212

SUMMARY OF THE DISCLOSURE

However, the wiring board of Patent Document 1 reduces the roughness of the interface with the wiring conductor by not depositing crystals from glass. Thus, in the wiring board of Patent Document 1, only a structure in which a non-crystallized glass is disposed at the interface with the wiring conductor can be adopted, and thus there is room for further improvement.

An object of the present disclosure is to solve the above problems and to provide a wiring board capable of reducing the roughness of an interface between a dielectric layer and a wiring conductor as compared with the conventional technology while reducing the limitation of the structure.

To achieve the above object, the present disclosure is configured as follows. A wiring board according to one aspect of the present disclosure includes: a wiring conductor; a first dielectric layer around the wiring conductor and containing a first glass and a first ceramic filler; and a second dielectric layer interposed between the wiring conductor and the first dielectric layer, the second dielectric layer being in contact with the wiring conductor and the first dielectric layer, and the second dielectric layer containing a second glass and a second ceramic filler, wherein a sintering temperature of the second glass contained in the second dielectric layer is higher than a sintering temperature of the wiring conductor, and a grain size of the second glass contained in the second dielectric layer is smaller than a grain size of the first glass contained in the first dielectric layer.

According to the present disclosure, it is possible to reduce the roughness of the interface between the dielectric layer and the wiring conductor as compared with the conventional technology while reducing the limitation of the structure.

BRIEF DESCRIPTION OF THE DRAWINGS

FIG. 7 is a table showing results of a performance evaluation test.

DETAILED DESCRIPTION OF THE PREFERRED EMBODIMENTS

Figure 1:
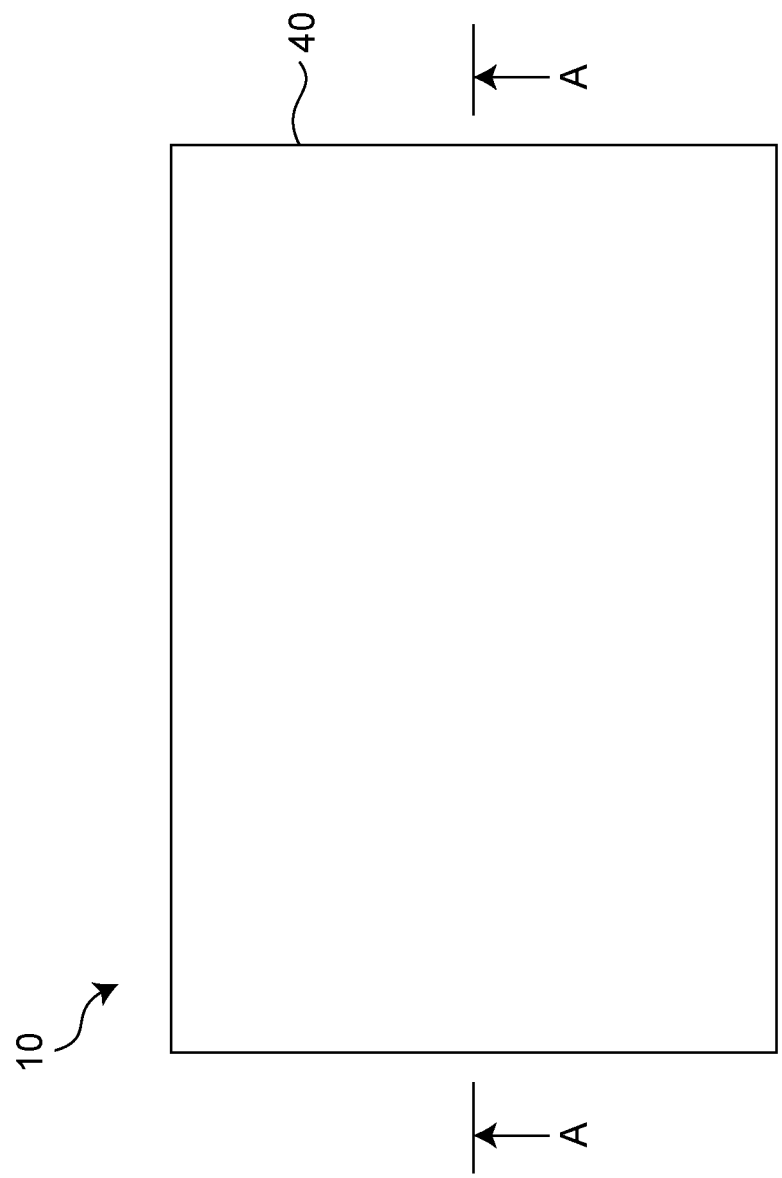
FIG. 1 is a plan view of a wiring board according to a first embodiment of the present disclosure.

A wiring board according to one aspect of the present disclosure includes: a wiring conductor; a first dielectric layer around the wiring conductor and containing a first glass and a first ceramic filler; and a second dielectric layer interposed between the wiring conductor and the first dielectric layer, the second dielectric layer being in contact with the wiring conductor and the first dielectric layer, and the second dielectric layer containing a second glass and a second ceramic filler, wherein a sintering temperature of the second glass contained in the second dielectric layer is higher than a sintering temperature of the wiring conductor, and a grain size of the second glass contained in the second dielectric layer is smaller than a grain size of the first glass contained in the first dielectric layer.

According to this configuration, the grain size of the second glass contained in the second dielectric layer is smaller than the grain size of the first glass contained in the first dielectric layer. Thus, the roughness of the interface between the second dielectric layer and the wiring conductor can be reduced as compared with a configuration in which the second dielectric layer is not provided and the first dielectric layer is in contact with the wiring conductor. As a result, transmission loss in the wiring conductor can be reduced.

According to this configuration, the sintering temperature of the second glass contained in the second dielectric layer is higher than the sintering temperature of the wiring conductor. Thus, during sintering of the wiring board, the wiring conductor is sintered before the second glass contained in the second dielectric layer is sintered in the process of increasing the temperature. This causes the second glass contained in the second dielectric layer to maintain the original grain shape during sintering of the wiring conductor. As a result, the roughness of the interface between the wiring conductor and the second dielectric layer can depend on the grain size of the second glass contained in the second dielectric layer.

If the grain size of the first glass contained in the first dielectric layer is as small as the grain size of the second glass contained in the second dielectric layer, that is, if the glass of all the dielectric layers is atomized, the degreasing property at the time of sintering the wiring board deteriorates. As a result, the gas generated by the combustion of a binder is less likely to escape, and the possibility of occurrence of structural defects such as peeling of the dielectric layer from the wiring conductor increases. According to this configuration, the grain size of the second glass contained in the second dielectric layer is smaller than the grain size of the first glass contained in the first dielectric layer. That is, only the glass of some dielectric layers is atomized. This can reduce occurrence of structural defects such as peeling of the dielectric layer from other layers as compared with a configuration in which the glass of all the dielectric layers is atomized.

According to this configuration, the first glass contained in the first dielectric layer and the second glass contained in the second dielectric layer may be a crystallized glass or a non-crystallized glass. That is, according to this configuration, the restriction of the structure of the wiring board can be reduced.

In the wiring board, the grain size of the second ceramic filler contained in the second dielectric layer may be smaller than the grain size of the first ceramic filler contained in the first dielectric layer.

According to this configuration, the grain size of the second ceramic filler contained in the second dielectric layer is smaller than the grain size of the first ceramic filler contained in the first dielectric layer. Thus, the roughness of the interface between the dielectric layer and the wiring conductor can be reduced as compared with a configuration in which the second dielectric layer is not provided and the first dielectric layer is in contact with the wiring conductor.

In the wiring board, a through via that penetrates the first dielectric layer and the second dielectric layer and is electrically connected to the wiring conductor may be formed in the first dielectric layer and the second dielectric layer.

According to this configuration, in the vicinity of the boundary between the through via and the wiring conductor, a decrease in conductivity of the wiring conductor is prevented because of a reduction in roughness of the interface between the wiring conductor and the second dielectric layer. Thus, since the roughness of the interface between a part of the through via and the second dielectric layer is reduced, transmission loss between the wiring conductor and the through via can be reduced as compared with a configuration in which only the first dielectric layer is provided.

In the wiring board, the through via may have a tapered shape that reduces its diameter in a direction toward the wiring conductor.

Normally, in a through via having a tapered shape, transmission loss is likely to occur in a part having a smaller diameter than a part having a larger diameter. According to this configuration, the part having a smaller diameter of the through via where transmission loss is likely to occur is positioned near the boundary with the wiring conductor. In the vicinity of the boundary, a decrease in conductivity of the wiring conductor is prevented because of a reduction in roughness of the interface between the wiring conductor and the second dielectric layer. Thus, transmission loss between the wiring conductor and the through via can be reduced.

First Embodiment

Figure 2:
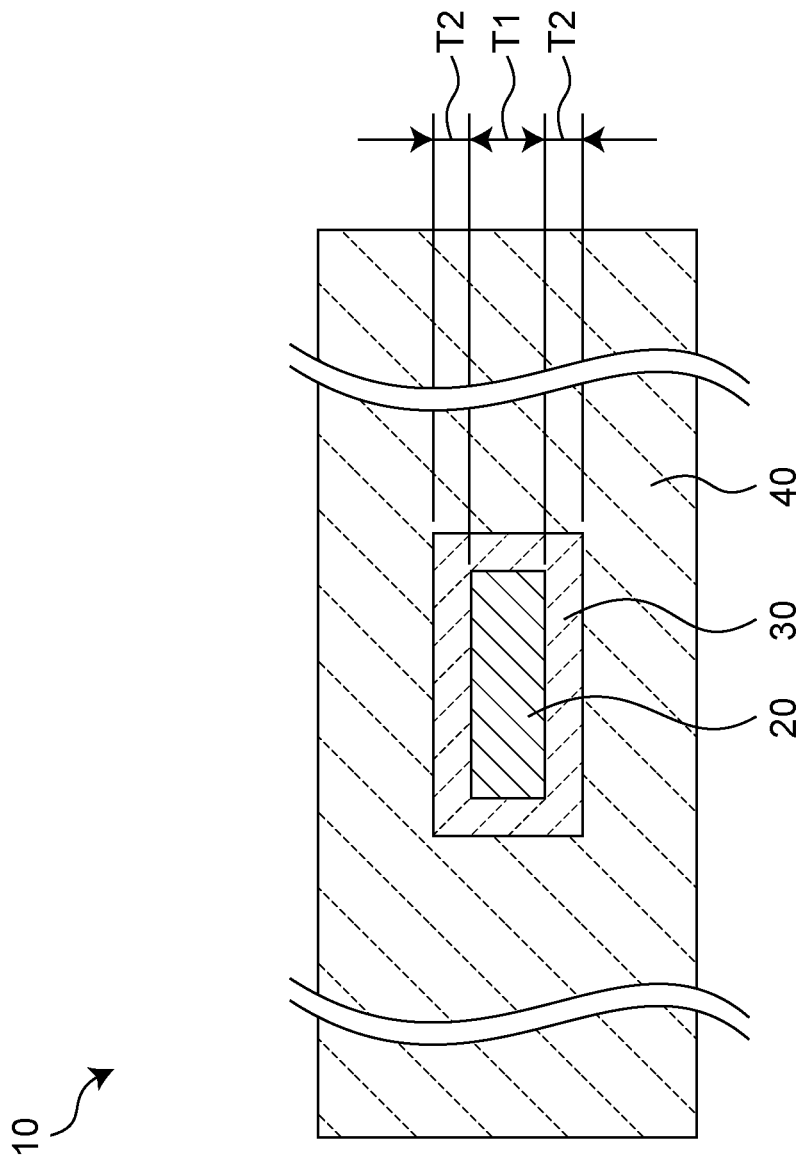
FIG. 2 is a longitudinal sectional view showing a section taken along the line A-A in FIG. 1.

FIG. 1 is a plan view of a wiring board according to a first embodiment of the present disclosure. FIG. 2 is a longitudinal sectional view showing a section taken along the line A-A in FIG. 1. In the wiring board, a wiring conductor is formed adjacent to a dielectric layer containing a crystallized glass and a ceramic filler. In the wiring board according to the first embodiment, a wiring conductor is formed inside.

As shown in FIGS. 1 and 2, a wiring board 10 has a rectangular parallelepiped shape. The shape of the wiring board 10 is not limited to a rectangular parallelepiped shape.

As shown in FIG. 2, the wiring board 10 includes a wiring conductor 20 and dielectric layers 30 and 40. The dielectric layer 30 is an example of the second dielectric layer. The dielectric layer 40 is an example of the first dielectric layer.

The wiring conductor 20 functions as a wiring that electrically connects a plurality of electronic components (not shown) to be mounted on the wiring board 10 to each other. The wiring conductor 20 can also function as an electrode to which an electronic component to be mounted on the wiring board 10 is electrically connected via solder or the like.

In the first embodiment, the wiring conductor 20 is covered with the dielectric layer 30. The wiring conductor 20 is formed inside the wiring board 10.

The wiring conductor 20 is obtained by printing a conductive paste on a surface of the dielectric layer 30. The conductive paste is made of, for example, copper.

The dielectric layer 30 covers the periphery of the wiring conductor 20. The dielectric layer 30 is in contact with the wiring conductor 20.

The dielectric layer 30 is made of a glass-ceramic. The dielectric layer 30 contains a crystallized glass and a ceramic filler. In the first embodiment, the dielectric layer is made of a crystallized glass and alumina and zirconia constituting the ceramic filler. In the first embodiment, the proportion of each material contained in the dielectric layer 30 is as follows. That is, the crystallized glass contained in the dielectric layer 30 is 98 (vol %) of the dielectric layer 30. The alumina contained in the dielectric layer 30 is 1.5 (vol %) of the dielectric layer 30. The zirconia contained in the dielectric layer 30 is 0.5 (vol %) of the dielectric layer 30.

The dielectric layer 40 covers the periphery of the dielectric layer 30. The dielectric layer 40 is in contact with the dielectric layer 30. On the other hand, in the first embodiment, the dielectric layer 40 is not in contact with the wiring conductor 20. That is, the dielectric layer 40 is provided around the wiring conductor 20, and the dielectric layer 30 is interposed between the wiring conductor 20 and the dielectric layer 40.

The dielectric layer 40 is made of a glass-ceramic. The dielectric layer 40 contains a crystallized glass and a ceramic filler. In the first embodiment, the dielectric layer contains the same materials as the dielectric layer 30 at the same proportions as in the dielectric layer 30. That is, dielectric layer 40 is made of a crystallized glass and alumina and zirconia constituting the ceramic filler. In the first embodiment, the crystallized glass contained in the dielectric layer 40 is 98 (vol %) of the dielectric layer 30. The alumina contained in the dielectric layer 40 is 1.5 (vol %) of the dielectric layer 30. The zirconia contained in the dielectric layer 40 is 0.5 (vol %) of the dielectric layer 30.

The grain size of the crystallized glass (specifically, the glass powder constituting the crystallized glass) contained in the dielectric layer 30 is smaller than the grain size of the crystallized glass contained in the dielectric layer 40. In the first embodiment, the grain size of each material (crystallized glass, alumina, and zirconia) contained in the dielectric layer 30 is the average grain size in the whole of the dielectric layer 30 or in any part of the dielectric layer 30 when the part is cut out. In the same manner, the grain size of each material (crystallized glass, alumina, and zirconia) contained in the dielectric layer 40 is the average grain size in the whole of the dielectric layer 40 or in any part of the dielectric layer 40 when the part is cut out.

The grain size of the crystallized glass contained in the dielectric layer 30 is smaller than the grain size of the crystallized glass contained in the dielectric layer 40. In the first embodiment, the grain size of the crystallized glass contained in the dielectric layer is 2.0 ($\mu$m) or less. In the first embodiment, the grain size of the crystallized glass contained in the dielectric layer 30 is 1.0 ($\mu$m) or less.

The grain size of each ceramic filler (specifically, alumina and zirconia) contained in the dielectric layer 30 is equal to or smaller than the grain size of each ceramic filler (specifically, alumina and zirconia) contained in the dielectric layer 40.

In the first embodiment, the grain size of the alumina contained in the dielectric layer 40 is 2.5 ($\mu$m). The grain size of the alumina contained in the dielectric layer 30 is 2.5 ($\mu$m) or less.

In the first embodiment, the grain size of the zirconia contained in the dielectric layer 40 is 1.3 ($\mu$m). The grain size of the zirconia contained in the dielectric layer 30 is 1.3 ($\mu$m) or less.

The sintering temperature of the crystallized glass contained in the dielectric layer is higher than the sintering temperature of the wiring conductor 20. In the first embodiment, the sintering temperature of the crystallized glass contained in the dielectric layer 30 is 900 to 950 (° C.). The sintering temperature of the wiring conductor 20 is 850 to 900 (° C.).

In the first embodiment, a thickness T1 of the wiring conductor 20 is larger than a thickness T2 of the dielectric layer 30. In the first embodiment, the thickness T1 of the wiring conductor 20 is 5 to 30 ($\mu$m), and the thickness T2 of the dielectric layer 30 is 5 to 20 ($\mu$m). The thickness T1 may be equal to or less than the thickness T2.

Figure 3:
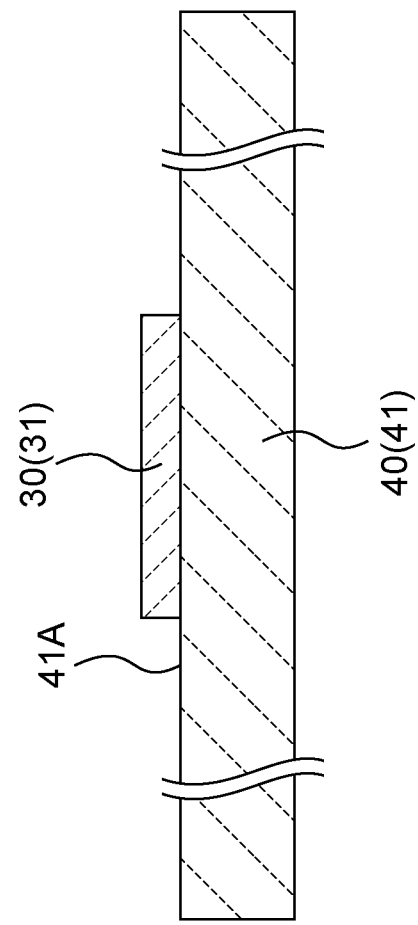
FIG. 3 is a longitudinal sectional view of a green sheet on which a ceramic paste is stacked.
Figure 4:
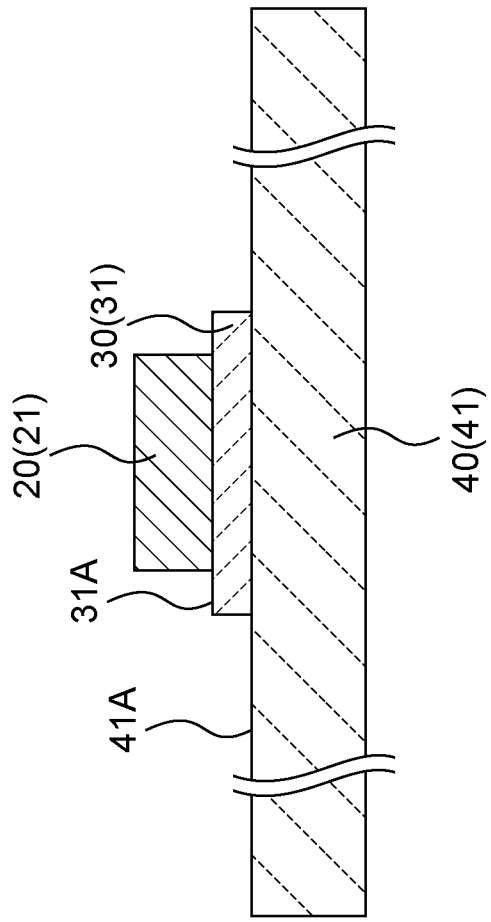
FIG. 4 is a longitudinal sectional view of a green sheet in which a conductor paste is stacked on the ceramic paste of FIG. 3.
Figure 5:
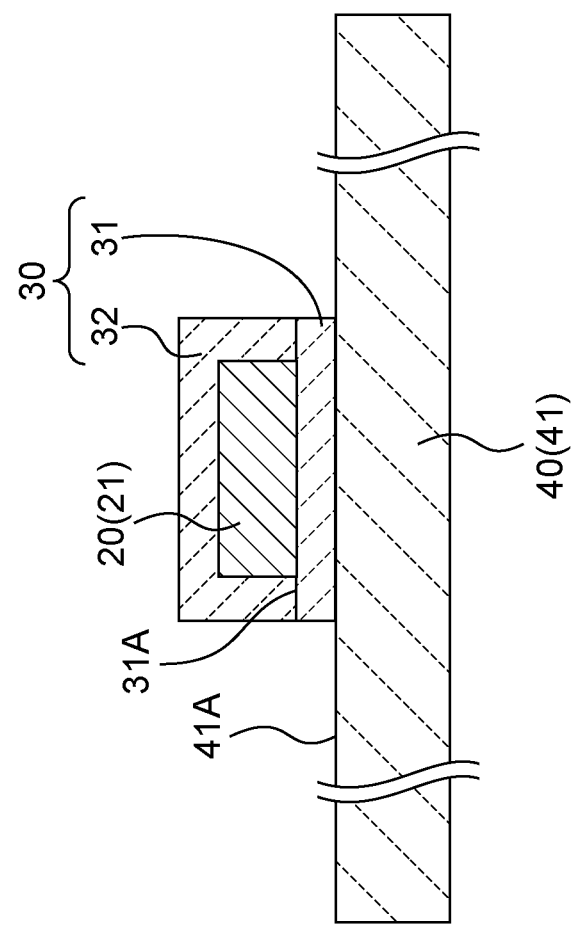
FIG. 5 is a longitudinal sectional view of a green sheet in which a ceramic paste is stacked on the ceramic paste and the conductor paste of FIG. 4.
Figure 6:
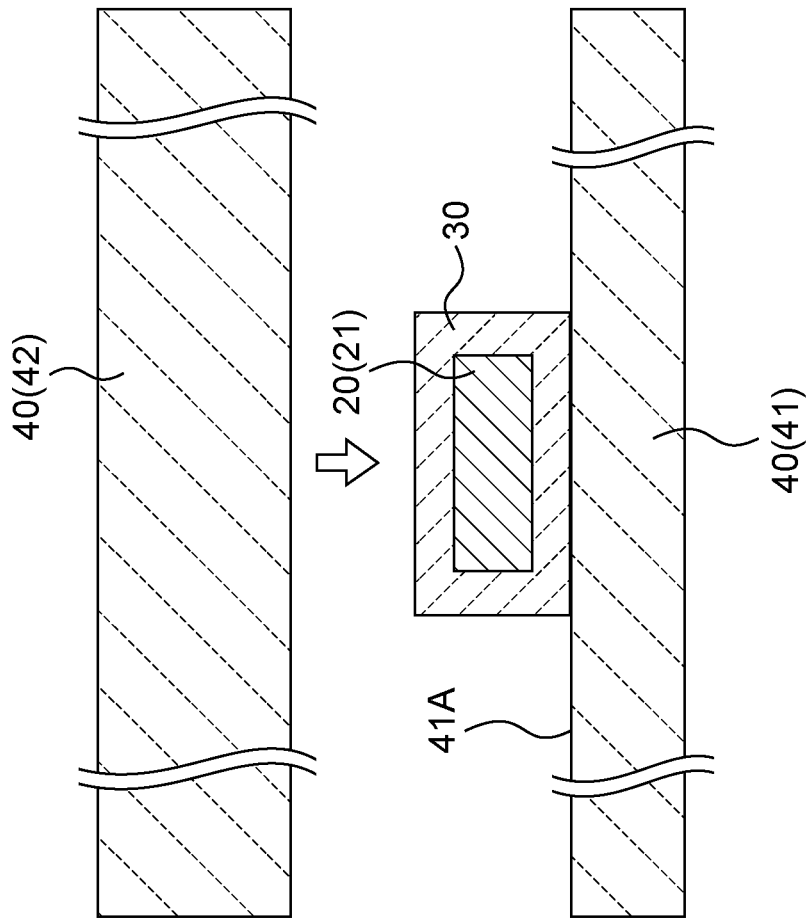
FIG. 6 is a longitudinal sectional view showing stacking of another green sheet on the green sheet of FIG. 5.

Hereinafter, an example of a method for producing the wiring board 10 according to the first embodiment will be described. FIG. 3 is a longitudinal sectional view of a green sheet on which a ceramic paste is stacked. FIG. 4 is a longitudinal sectional view of a green sheet in which a conductor paste is stacked on the ceramic paste of FIG. 3. FIG. 5 is a longitudinal sectional view of a green sheet in which a ceramic paste is stacked on the ceramic paste and the conductor paste of FIG. 4. FIG. 6 is a longitudinal sectional view showing stacking of another green sheet on the green sheet of FIG. 5.

First, a green sheet 41 constituting a part of the dielectric layer 40 is produced by a known process (see FIG. 3). In the first embodiment, as described above, the materials of the green sheet 41 are 98 (vol %) of crystallized glass, 1.5 (vol %) of alumina, and 0.5 (vol %) of zirconia.

Next, as shown in FIG. 3, a ceramic paste 31 constituting a part of the dielectric layer 30 is printed on a principal surface 41A of the green sheet 41 by a known process. In the first embodiment, the materials of the ceramic paste 31 are the same as that of the green sheet 41. However, the grain size of the crystallized glass contained in the ceramic paste 31 is smaller than the grain size of the crystallized glass contained in the green sheet 41. The grain size of each of the alumina and zirconia contained in the ceramic paste 31 is equal to or smaller than the grain size of each of the alumina and zirconia contained in the green sheet 41.

Next, as shown in FIG. 4, a conductive paste 21 constituting the wiring conductor is printed on a principal surface 31A of the ceramic paste 31 by a known process. In the first embodiment, the material of the conductive paste 21 is copper.

Next, as shown in FIG. 5, a ceramic paste 32 constituting the rest of the dielectric layer 30 is printed on the principal surface 31A of the ceramic paste 31 by a known process so as to cover the conductive paste 21. This causes the conductive paste 21 to be buried in the dielectric layer 30 constituted by the ceramic pastes 31 and 32. The material of the ceramic paste 32 is the same as that of the ceramic paste 32.

Next, as shown in FIG. 6, a green sheet 42 constituting the rest of the dielectric layer 40 is stacked on the principal surface 41A of the green sheet 41 so as to cover the dielectric layer 30 by a known process. This causes the dielectric layer 30 to be buried in the dielectric layer 40 constituted by the green sheets 41 and 42. The material of the green sheet 42 is the same as that of the green sheet 41.

Next, a stack formed by the step shown in FIG. 6 is sintered. The wiring board shown in FIG. 2 is thus completed.

Hereinafter, results of a performance evaluation test performed on the wiring boards according to examples 1 to 6 and the wiring boards according to comparative examples 1 and 2 will be described. FIG. 7 is a table showing the results of the performance evaluation test.

In each of the wiring boards 10 according to examples 1 to 3, the grain size of the crystallized glass contained in the dielectric layer 30 is smaller than the grain size of the crystallized glass contained in the dielectric layer 40. On the other hand, in each of the wiring boards 10 according to examples 1 to 3, the grain size of each of the alumina and zirconia contained in the dielectric layer 30 is the same as the grain size of each of the alumina and zirconia contained in the dielectric layer 40.

In each of the wiring boards 10 according to examples 4 to 6, the grain size of the crystallized glass contained in the dielectric layer 30 is smaller than the grain size of the crystallized glass contained in the dielectric layer 40. In each of the wiring boards 10 according to examples 4 to 6, the grain size of each of the alumina and zirconia contained in the dielectric layer 30 is smaller than the grain size of each of the alumina and zirconia contained in the dielectric layer 40.

Each of the wiring boards according to comparative examples 1 and 2 includes the wiring conductor 20 and the dielectric layers 30 and 40, as in each of the wiring boards 10 according to examples 1 to 6. However, in each of the wiring boards according to comparative examples 1 and 2, the grain size of the crystallized glass contained in the dielectric layer 30 is the same as the grain size of the crystallized glass contained in the dielectric layer 40. In each of the wiring boards according to comparative examples 1 and 2, the grain size of each of the alumina and zirconia contained in the dielectric layer 30 is the same as the grain size of each of the alumina and zirconia contained in the dielectric layer 40.

As the performance evaluation, three items of Rmax, presence or absence of transmission loss, and presence or absence of delamination were evaluated.

Rmax is the maximum height of the irregularities of the interface between the wiring conductor 20 and the dielectric layer 30, and the unit is micrometers (μm).

A tri-plate line having a width of 50 (μm) and a thickness of 7 (μm) of the wiring conductor 20 was produced, and the presence or absence of transmission loss was evaluated. When transmission is improved by 0.01 (dB/mm) or more at 60 (GHz), "∘" is given in FIG. 7 as an evaluation of transmission loss. When transmission is improved by 0.02 (dB/mm) or more at 60 (GHz), double circles is given in FIG. 7 as an evaluation of transmission loss. When the improvement in transmission is less than 0.01 (dB/mm), it is assumed that transmission loss has occurred, and "x" is given in FIG. 7.

The delamination is peeling of the dielectric layer 30 from the wiring conductor When a section of the wiring board 10 is observed, and there is even one gap of 5 (μm) or more continuing 1 (mm) or more in a length direction in the section, it is assumed that delamination has occurred, and "x" is given in FIG. 7. In the other cases than the above, it is assumed that delamination has not occurred, and "∘" is given in FIG. 7.

As can be seen from FIG. 7, in the wiring board 10 according to example 3, the value of Rmax is smaller than that of the wiring boards according to comparative examples 1 and 2. That is, it can be seen that, in the wiring board 10 according to example 3, the irregularities of the interface between the wiring conductor 20 and the dielectric layer 30 is reduced as compared with the wiring boards according to comparative examples 1 and 2.

As can be seen from FIG. 7, in the wiring boards 10 according to examples 1 to 3, transmission loss is practically acceptable, and delamination does not occur. On the other hand, transmission loss has occurred in the wiring board according to comparative example 1, and delamination has occurred in the wiring board according to comparative example 2.

As can be seen from FIG. 7, in the wiring boards 10 according to examples 4 to 6, the value of Rmax is smaller than that of the wiring boards according to examples 1 to 3. That is, it can be seen that, in the wiring boards 10 according to examples 4 to 6, the irregularities of the interface between the wiring conductor 20 and the dielectric layer 30 is reduced as compared with the wiring boards according to examples 1 to 3.

As can be seen from FIG. 7, in the wiring boards 10 according to examples 4 to 6, transmission loss is reduced as compared with the wiring boards 10 according to example 1 to 3. In the wiring boards 10 according to examples 4 to 6, delamination does not occur as in the wiring boards 10 according to examples 1 to 3.

According to the first embodiment, the grain size of the crystallized glass contained in the dielectric layer 30 is smaller than the grain size of the crystallized glass contained in the dielectric layer 40. Thus, the roughness of the interface between the dielectric layer 30 and the wiring conductor 20 can be reduced as compared with a configuration in which the dielectric layer 30 is not provided and the dielectric layer 40 is in contact with the wiring conductor 20. As a result, transmission loss in the wiring conductor 20 can be reduced. In addition, peeling of the wiring conductor 20 from the dielectric layer can be reduced as compared with the conventional technology.

According to the first embodiment, the sintering temperature of the crystallized glass contained in the dielectric layer 30 is higher than the sintering temperature of the wiring conductor 20. Thus, during sintering of the wiring board 10, the wiring conductor 20 is sintered before the crystallized glass contained in the dielectric layer 30 is sintered in the process of increasing the temperature. This causes the crystallized glass contained in the dielectric layer 30 to maintain the original grain shape during sintering of the wiring conductor 20. As a result, the roughness of the interface between the wiring conductor 20 and the dielectric layer 30 can depend on the grain size of the crystallized glass contained in the dielectric layer 30.

If the grain size of the crystallized glass contained in the dielectric layer 40 is as small as the grain size of the crystallized glass contained in the dielectric layer 30, that is, if the glass of all the dielectric layers (dielectric layers 30 and 40) is atomized, the degreasing property at the time of sintering the wiring board 10 deteriorates. As a result, the gas generated by the combustion of a binder is less likely to escape, and the possibility of occurrence of structural defects such as peeling of the dielectric layer from the wiring conductor increases. According to the first embodiment, the grain size of the crystallized glass contained in the dielectric layer 30 is smaller than the grain size of the crystallized glass contained in the dielectric layer 40. That is, only the crystallized glass of some dielectric layers (dielectric layers 30) is atomized. This can reduce occurrence of structural defects such as peeling of the dielectric layer from other layers as compared with a configuration in which the crystallized glass of all the dielectric layers (dielectric layers 30 and 40) is atomized.

According to the first embodiment, both the dielectric layers 30 and 40 contain a crystallized glass. Thus, the strength and heat resistance of the wiring board 10 can be favorably maintained as compared with a configuration in which a non-crystallized glass is used instead of a crystallized glass for at least one of the dielectric layers 30 and 40.

According to the first embodiment, the grain size of the ceramic filler contained in the dielectric layer 30 is smaller than the grain size of the ceramic filler contained in the dielectric layer 40. Thus, the roughness of the interface between the dielectric layer 30 and the wiring conductor 20 can be reduced as compared with a configuration in which the dielectric layer 30 is not provided and the dielectric layer 40 is in contact with the wiring conductor 20.

In the first embodiment, the grain size of each ceramic filler (specifically, alumina and zirconia) contained in the dielectric layer 30 is equal to or smaller than the grain size of each ceramic filler (specifically, alumina and zirconia) contained in the dielectric layer 40. However, the grain size of each ceramic filler contained in the dielectric layer 30 may be larger than the grain size of each ceramic filler contained in the dielectric layer 40.

The proportion of each material contained in the dielectric layers 30 and 40 is not limited to the proportion described above. However, the proportion of the crystallized glass contained in the dielectric layers 30 and 40 is desirably 80 (vol %) or more.

In the dielectric layers 30 and 40, the ceramic filler is not limited to alumina and zirconia. For example, the ceramic filler may contain quartz, titania, or the like instead of at least one of alumina or zirconia, or in addition to at least one of alumina or zirconia.

The proportion of each of the crystallized glass, alumina, and zirconia contained in the dielectric layer 30 may be different from the proportion of each of the crystallized glass, alumina, and zirconia contained in the dielectric layer 40.

In the first embodiment, the wiring conductor is formed inside the wiring board. However, the wiring conductor may be formed on an outer surface of the wiring board.

In the first embodiment, each of the dielectric layers 30 and 40 is made of a glass-ceramic and contains a crystallized glass. However, the glass contained in the dielectric layers 30 and 40 is not limited to a crystallized glass, and may be a non-crystallized glass. For example, both of the dielectric layers 30 and 40 may contain a non-crystallized glass. For example, the dielectric layer 30 may contain a crystallized glass, and the dielectric layer 40 may contain a non-crystallized glass. For example, the dielectric layer 40 may contain a crystallized glass, and the dielectric layer 30 may contain a non-crystallized glass. In this manner, according to the first embodiment, since the glass contained in the dielectric layers 30 and 40 is not limited to either a crystallized glass or a non-crystallized glass, the restriction of the structure of the wiring board 10 can be reduced.

Second Embodiment

Figure 8:
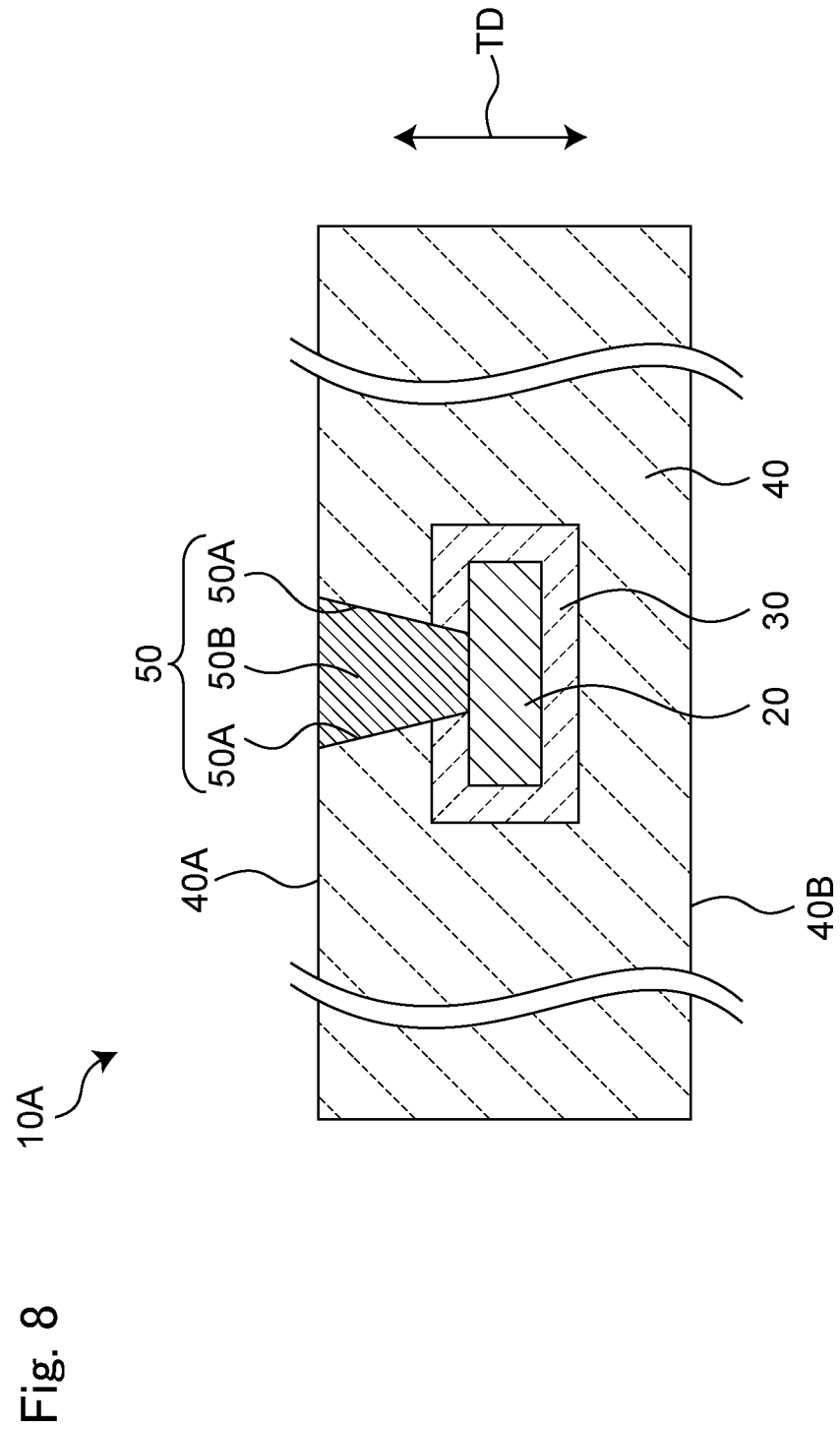
FIG. 8 is a longitudinal sectional view of a wiring board according to a second embodiment of the present disclosure, corresponding to the section taken along the line A-A in FIG. 1.

FIG. 8 is a longitudinal sectional view of a wiring board according to a second embodiment of the present disclosure, corresponding to the section taken along the line A-A in FIG. 1. A wiring board 10A according to the second embodiment is different from the wiring board 10 according to the first embodiment in that a through via 50 penetrating the dielectric layers 30 and 40 is further provided. Hereinafter, differences from the first embodiment will be described. Common points with the wiring board 10 of the first embodiment are denoted by the same reference numerals, and description thereof will be omitted in principle and described as necessary.

As shown in FIG. 8, the through via 50 is formed in the dielectric layers 30 and 40. The through via 50 is formed by filling a through hole (via) 50A penetrating the dielectric layers 30 and 40 with a conductive paste 50B and co-sintering with the ceramic. The conductive paste 50B is made of, for example, copper. The through via 50 is exposed to the outside of the wiring board 10A via a principal surface 40A of the dielectric layer 40. The through via 50 is exposed to the wiring conductor 20. This causes the through via 50 to be electrically connected to the wiring conductor 20. In the second embodiment, one end of the through via 50 in a penetrating direction is electrically connected to the wiring conductor 20, and the other end of the through via 50 in the penetrating direction is exposed to the outside of the wiring board 10A.

A surface constituting the through hole 50A is inclined with respect to a thickness direction TD of the wiring board 10A. The diameter of the through hole 50A decreases from the principal surface 40A of the dielectric layer 40 toward the wiring conductor 20. That is, the through via 50 has a tapered shape that reduces its diameter toward the wiring conductor 20. In other words, the through via 50 has a truncated cone shape.

According to the second embodiment, in the vicinity of the boundary between the through via 50 and the wiring conductor 20, a decrease in conductivity of the wiring conductor 20 is prevented because of a reduction in roughness of the interface between the wiring conductor 20 and the dielectric layer 30. Thus, since the roughness of the interface between a part of the through via 50 and the dielectric layer 30 is reduced, transmission loss between the wiring conductor 20 and the through via 50 can be reduced as compared with a configuration in which only the dielectric layer 40 is provided.

Normally, in the through via 50 having a tapered shape, transmission loss is likely to occur in a part having a smaller diameter than a part having a larger diameter. According to the second embodiment, the part having a smaller diameter of the through via 50 where transmission loss is likely to occur is positioned near the boundary with the wiring conductor 20. In the vicinity of the boundary, a decrease in conductivity of the wiring conductor 20 is prevented because of a reduction in roughness of the interface between the wiring conductor 20 and the dielectric layer 30. Thus, transmission loss between the wiring conductor 20 and the through via 50 can be reduced.

In the second embodiment, the through via 50 has a tapered shape that reduces its diameter toward the wiring conductor 20, but the through via is not limited to such a shape. For example, the diameter of the through via 50 may be constant. That is, the through via 50 may have a cylindrical shape.

In the second embodiment, the through via 50 is exposed to the outside of the wiring board 10A. However, the through via 50 does not have to be exposed to the outside of the wiring board 10A. For example, when the wiring board 10A is a multilayer board, the through via 50 may be formed in a board constituting an inner layer of the wiring board 10A.

In the second embodiment, one through via 50 is formed in the wiring board 10A, but the number of through via 50 is not limited to one and may be plural. In the second embodiment, the through via 50 is formed on the principal surface 40A of the dielectric layer 40, but the through via 50 may be formed on a surface other than the principal surface 40A, for example, a principal surface 40B of the dielectric layer 40. The principal surface 40B is the surface opposite to the principal surface 40A. The through via 50 may be formed on a plurality of surfaces. For example, the through via 50 may be formed on both the principal surfaces 40A and 40B.

By appropriately combining any embodiments among the various embodiments described above, the effects of the respective embodiments can be achieved.

Although the present disclosure has been sufficiently described in connection with preferable embodiments with reference to the drawings as appropriate, various modifications and corrections are apparent to those skilled in the art. Such modifications and corrections should be understood to be included within the scope of the present disclosure according to the appended claims as long as they do not depart from the scope of the present disclosure.

EXPLANATION OF REFERENCE NUMBERS 10 wiring board
20 wiring conductor
30 dielectric layer (second dielectric layer)
40 dielectric layer (first dielectric layer)
50 through via

What is claimed is:
1. A wiring board comprising:
a wiring conductor;
a first dielectric layer around the wiring conductor and containing a first glass and a first ceramic filler; and a second dielectric layer interposed between the wiring conductor and the first dielectric layer, the second dielectric layer being in contact with the wiring conductor and the first dielectric layer, and the second dielectric layer containing a second glass and a second ceramic filler, wherein a sintering temperature of the second glass contained in the second dielectric layer is higher than a sintering temperature of the wiring conductor, and wherein a grain size of the second glass contained in the second dielectric layer is smaller than a grain size of the first glass contained in the first dielectric layer.

2. The wiring board of claim 1, wherein a grain size of the second ceramic filler contained in the second dielectric layer is equal to or smaller than a grain size of the first ceramic filler contained in the first dielectric layer.

3. The wiring board of claim 1, wherein the grain size of the first glass is 2.0 (μm) or less, and the grain size of the second glass is 1.0 (μm) or less.

4. The wiring board of claim 1, further comprising a through via penetrating the first dielectric layer and the second dielectric layer and electrically connected to the wiring conductor.

5. The wiring board of claim 4, wherein the through via has a tapered shape where the diameter thereof reduces in a direction toward the wiring conductor.

6. The wiring board of claim 1, wherein the first ceramic filler and the second ceramic filler comprise alumina and zirconia.

7. The wiring board of claim 6, wherein the first dielectric layer contains 98 (vol %) of the first glass, 1.5 (vol %) of the alumina, and 0.5 (vol %) of the zirconia.

8. The wiring board of claim 7, wherein the second dielectric layer contains 98 (vol %) of the second glass, 1.5 (vol %) of the alumina, and 0.5 (vol %) of the zirconia.

9. The wiring board of claim 6, wherein a grain size of each of the alumina and zirconia in the second ceramic filler contained in the second dielectric layer is equal to or smaller than a grain size of each of the alumina and zirconia in the first ceramic filler contained in the first dielectric layer.

10. The wiring board of claim 1, wherein the sintering temperature of the crystallized glass contained in the second dielectric layer is 900 to 950 (° C.), and the sintering temperature of the wiring conductor is 850 to 900 (° C.).

11. The wiring board of claim 1, wherein a thickness of the wiring conductor is larger than a thickness of the second dielectric layer.

12. The wiring board of claim 11, wherein the thickness of the wiring conductor is 5 to 30 (μm), and the thickness of the second dielectric layer is 5 to 20 (μm).

13. The wiring board of claim 1, wherein a thickness of the wiring conductor is equal to or less than a thickness of the second dielectric layer.

14. The wiring board of claim 1, wherein the first glass contained in the first dielectric layer and the second glass contained in the second dielectric layer are a crystallized glass.

* * * * *